United States Patent
Bollenbeck et al.

(10) Patent No.: US 7,606,551 B2
(45) Date of Patent: Oct. 20, 2009

(54) MIXER CIRCUIT WITH BALANCED FREQUENCY MIXER WITH VARACTOR DIODES

(75) Inventors: Jan Bollenbeck, Eggolsheim (DE);
Martin Hergt, Chatelaine (CH);
Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 434 days.

(21) Appl. No.: 11/680,720

(22) Filed: Mar. 1, 2007

(65) Prior Publication Data
US 2007/0207763 A1    Sep. 6, 2007

(30) Foreign Application Priority Data
Mar. 1, 2006   (DE)   ........................ 10 2006 009 435

(51) Int. Cl.
*H04B 1/26* (2006.01)
*H04B 15/00* (2006.01)

(52) U.S. Cl. ...................... 455/326; 455/189.1; 455/313

(58) Field of Classification Search ................ 455/326, 455/189.1, 190.1, 191.1, 307, 313, 330, 323; 324/307, 313, 322
See application file for complete search history.

(56) References Cited

U.S. PATENT DOCUMENTS

| | | | | |
|---|---|---|---|---|
| 4,637,069 A | * | 1/1987 | Charbonnier | 455/330 |
| 4,641,101 A | * | 2/1987 | Selim | 327/117 |
| 4,654,597 A | * | 3/1987 | Hino | 324/322 |
| 5,034,994 A | * | 7/1991 | Muterspaugh et al. | 455/326 |
| 5,170,123 A | * | 12/1992 | Holland et al. | 324/322 |
| 5,893,030 A | * | 4/1999 | De Loe et al. | 455/321 |
| 7,365,804 B2 | * | 4/2008 | Yamamoto | 348/731 |

FOREIGN PATENT DOCUMENTS

DE    41 16 537 A1    2/1993

OTHER PUBLICATIONS

"Electronics Engineers' Handbook," 2d Ed., Fink Ed. (1982) p. 14-62.
"The Art of Electronics 2d Ed," Horowitz et al. (1989), pp. 885-886.

* cited by examiner

*Primary Examiner*—Sonny Trinh
(74) *Attorney, Agent, or Firm*—Schiff Hardin LLP

(57) ABSTRACT

In a mixer circuit with a balanced frequency mixer with varactor diodes, a first input signal that exhibits a first input frequency can be fed to the frequency mixer via a first input. Furthermore, a second input signal that exhibits a second input frequency can be fed to the frequency mixer via a second input. The frequency mixer has at least two amplifier elements fashioned as varactor diodes. These amplifier elements mix the input signals with one another into a mix signal with a first signal component and a second signal component. The first signal component exhibits a first component frequency, the second signal component a second component frequency. The first component frequency is equal to the sum of the first and second input frequencies, the second component frequency is equal to the difference of the first and second input frequencies. An output signal that contains at least one of the signal components can be tapped via the output. The frequency mixer is fashioned as a balanced frequency mixer in which at least the second input and the output are decoupled from one another. The second input frequency is a multiple of the first input frequency. An adjustment circuit for adjustment of an operating point of the varactor diodes is connected in parallel with each varactor diode.

5 Claims, 2 Drawing Sheets

MIXER CIRCUIT WITH BALANCED FREQUENCY MIXER WITH VARACTOR DIODES

BACKGROUND OF THE INVENTION

1. Field of the Invention

The present invention concerns a mixer circuit of the type having a first input, a second input, a frequency mixer and an output.

2. Description of the Prior Art

A mixer circuit of the above type is known from DE 102 19 749 A1. In this mixer circuit a first input signal can be fed to the frequency mixer via the first input, and a second input signal via the second input. The first input signal exhibits a first input frequency, the second input signal exhibits a second input frequency. The frequency mixer has an amplifier element by means of which it mixes the input signals with one another into a mix signal. The mix signal has a first signal component and a second signal component, the first signal portion exhibiting a component frequency and the second signal portion exhibiting a second component frequency. The first component frequency is equal to the sum of the input frequencies and the second component frequency is equal to the difference of the input frequencies. An output signal that is one of the signal component of the mix signal can be tapped via the output. The second input frequency is significantly higher than the first input frequency.

A mixer circuit with a first input, a second input, a frequency mixer and an output is likewise known from the textbook "Electronic Engineers Handbook" by Donald G. Fink and Donald Christiansen, McGraw-Hill, 1982, page 14-62. Here as well input signals that exhibit corresponding input frequencies can again be fed to the inputs. Furthermore, here the frequency mixer also mixes the input signals into a mix signal with two signal components, one signal component having frequency that is the sum of the input frequencies and the other signal component having a frequency that is the difference of the input frequencies. An output signal that has at least one of the signal components of the mix signal can again be tapped via the output. The frequency mixer has at least two amplifier elements by means of which it mixes the input signals with one another. It is fashioned as a balanced frequency mixer in which at least the second input and the output are decoupled from one another.

Further mixer circuits are described in DE 41 26 537 A1 and the textbook "The Art of Electronics", Paul Horowitz and Winfield Hill, 2nd edition, Cambridge University Press 1989.

Varactor diodes can be operated as components known as parametric up-mixers (forward mixers). If a high mix amplification of the first input signal is desired in a parametric up-mixer, the second input frequency must be higher by a large factor than the first input frequency. The relative interval of the two component frequencies from the second input frequency is therefore rather small.

If an unbalanced frequency mixer is used as a frequency mixer, selective filters that exhibit a high performance (quality) must be used at the second input and at the output.

SUMMARY OF THE INVENTION

An object of the present invention is to provide a mixer circuit in which a high mix amplification can be achieved with relatively low effort and in a simple manner with simultaneous decoupling of the output from the second input. The frequencies fed in via the second input thus should not be present at the output, and vice versa.

The above object is achieved in accordance with the principles of the present invention by a mixer circuit with a balanced frequency mixer with varactor diodes. The frequency mixer has a first input to which a first input signal is supplied, that exhibits a first input frequency. The frequency mixer has a second input supplied with a second input signal that exhibits a second input frequency. The frequency mixer has at least two amplifier elements formed by varactor diodes. These amplifier elements mix the input signals with each other to form a mix signal with a first signal component and a second signal component. The first signal component exhibits a first component frequency and the second signal component exhibits a second component frequency. The first component frequency is the sum of the first and second input frequencies, and the second component frequency is the difference between the first and second input frequencies. An output signal that contains at least one of the signal components can be tapped via the output. The frequency mixer is fashioned as a balanced frequency mixer, in which at least the second input and the output are decoupled from each other. The second input frequency is a multiple of the first frequency. Each varactor diode has an adjustment circuit connected in parallel therewith, that adjusts the operating point of that varactor diode.

DESCRIPTION OF THE PREFERRED EMBODIMENTS

Figure 1:
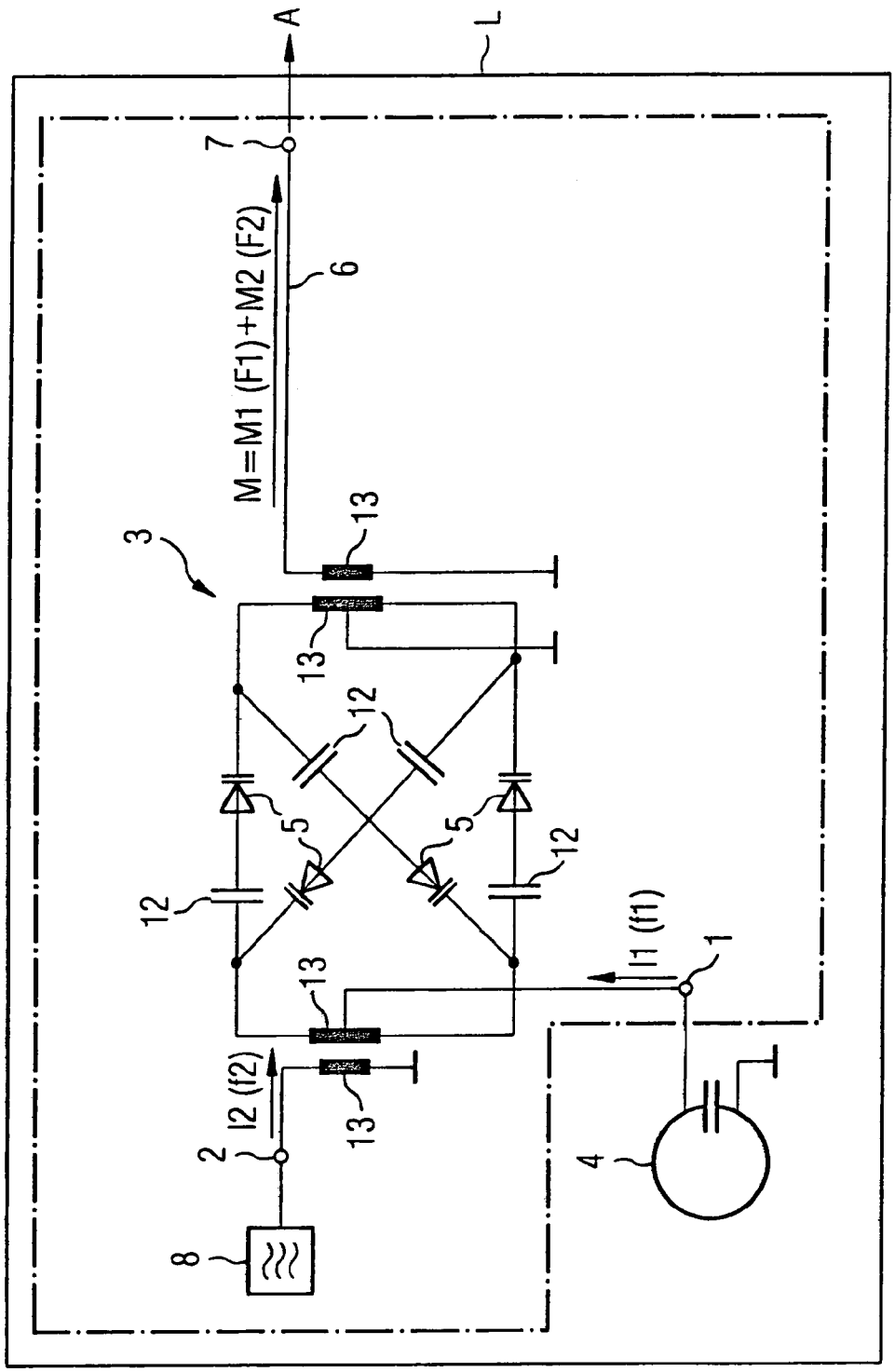
FIG. 1 schematically illustrates a first embodiment of the present invention.
Figure 2:
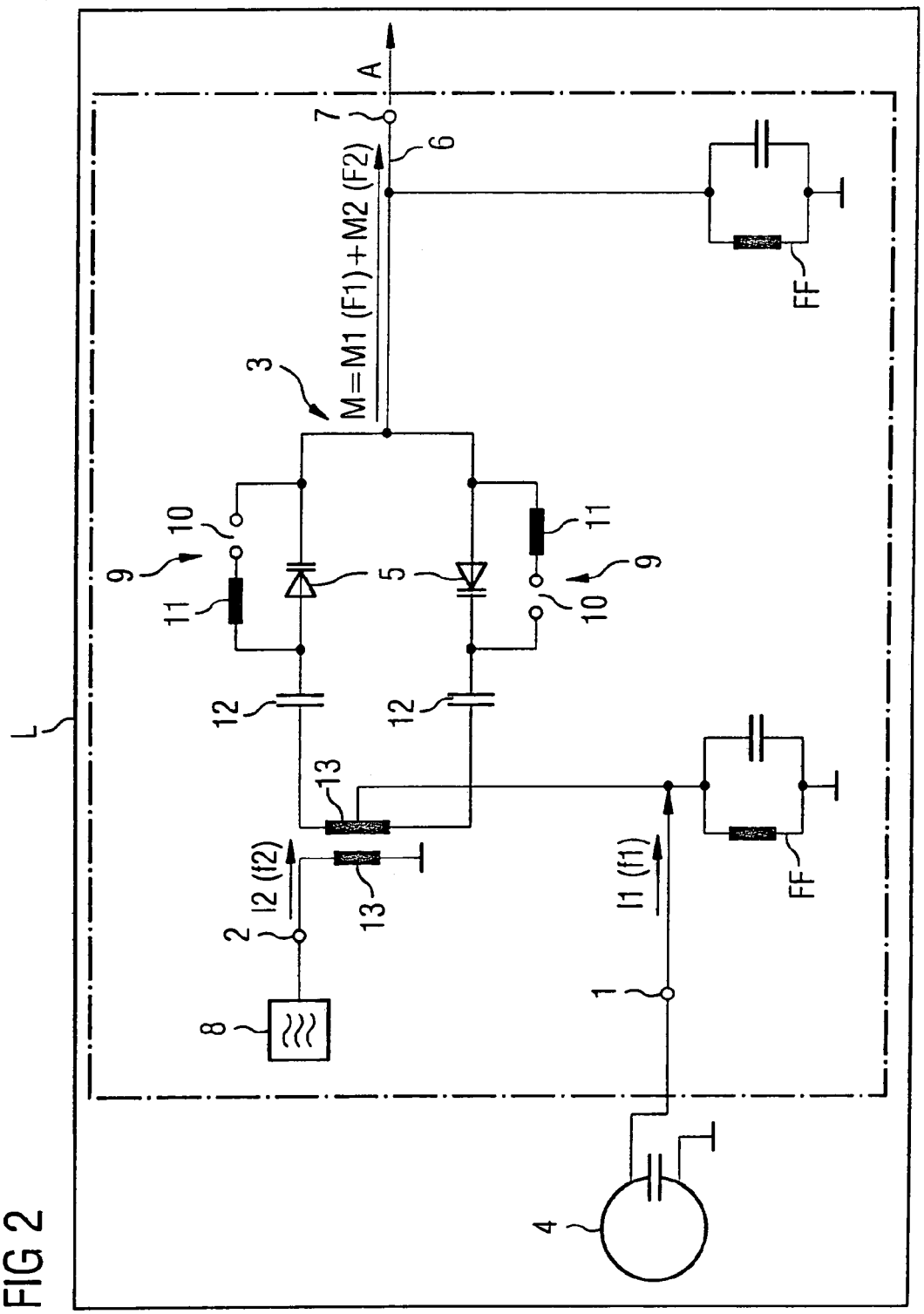
FIG. 2 schematically illustrates a second embodiment of the present invention.

In FIGS. 1 and 2, similar elements are provided with the same reference characters.

FIGS. 1 and 2 show the basic principle of the present invention. According to FIGS. 1 and 2, the mixer circuit has a first input 1 and a second input 2. A first input signal I1 and a second input signal I2 can be fed to a frequency mixer 3 via the inputs 1, 2. The first input signal I1 exhibits a first input frequency f1, the second input signal 2 a second input frequency f2. The second input frequency f2 is a multiple of the first input frequency f1. The multiple must not be an even-numbered multiple.

For example, the inventive mixer circuit can be a component of a local coil L for magnetic resonance applications. In this case the first input signal I1 would advantageously correspond to the acquisition signal of an acquisition arrangement 4 of the local coil L.

The frequency mixer 3 is fashioned as a single or double balanced frequency mixer 3. It therefore has at least two amplifier elements 5 by means of which the input signals I1, I2 are mixed into a mix signal M. The mix signal M has a first signal component M1 and a second signal component M2. The first signal component M1 exhibits a first component frequency F1 that is equal to the sum of the two input frequencies f1, f2. The second signal portion M2 exhibits a second component frequency F2 that is equal to the difference of the two input frequencies f1, f2. The mix signal M is fed into an output line 6 that proceeds to an output 7. An output signal A can therefore be tapped via the output 7. The output signal A has at least one of the two signal components M1, M2 of the mix signal M, namely at least the first signal components M1.

As already mentioned, the frequency mixer 3 is fashioned as a balanced frequency mixer 3. When the frequency mixer 3 is fashioned as a double balanced frequency mixer 3 (see FIG. 1), both inputs 1, 2 are decoupled from one another and each of the two inputs 1, 2 are decoupled from the output 7. Given design as a single balanced frequency mixer 3 (see FIG. 2), the second input 2 is decoupled from the output 7 and from the first input 1. In this case frequency filters FF are associated with the first input 1 and the output 7, by means of which frequency filters FF the component frequencies F1, F2 or the first input frequency f1 can be filtered out.

The amplifier elements 5 are fashioned as varactor diodes 5. Varactor diodes exhibit the advantageous property that they intrinsically amplify the first input signal I1. It is thus possible for the mixer circuit to have no amplifier elements with the exception of the varactor diodes 5.

It is possible to feed the second input signal I2 to the mixer circuit from the outside. The mixer circuit can also have a signal generator 8 that is connected with the second input 2. In this case the signal generator 8 generates the second input signal I2.

According to FIG. 2, each varactor diode has an adjustment circuit 9 connected in parallel therewith for adjustment of the operating point of that varactor diode 5. Each adjustment circuit 9 includes a direct voltage source 10 and an inductor 11 connected in series with the direct voltage source 10. To decouple the adjustment circuits 9 from one another, a decoupling capacitor 12 is arranged upstream or downstream from the parallel circuit of the varactor diode 5 and the corresponding adjustment circuit 9.

The adjustment circuits 9 are also present in the embodiment according to FIG. 1, but are not shown therein.

According to FIGS. 1 and 2, the balancing of the frequency mixer 3 ensues via repeaters 13, but this type of balancing is only exemplary.

Although modifications and changes may be suggested by those skilled in the art, it is the intention of the inventors to embody within the patent warranted hereon all changes and modifications as reasonably and properly come within the scope of their contribution to the art.

We claim as our invention:

1. A mixer circuit for use with a first input signal exhibiting a first input frequency and a second input signal that exhibits a second input frequency, said mixer circuit comprising:
    a balanced frequency mixer having a first input to which said first input signal is supplied and a second input to which said second input signal is supplied, said balanced frequency mixer comprising at least two amplifier elements respectively formed by varactor diodes that mix said first and second input signals with each other to form a mix signal having a first signal component and a second signal component, said first signal component exhibiting a first component frequency that is a sum of the frequencies of said first and second input signals, and said second signal component having a second component frequency that is a difference between the frequencies of the first and second input signals;
    said frequency mixer being connected to an output at which an output signal is tapped that comprises at least one of said first signal component and said second signal component; and
    said second input being decoupled from said output and said second input frequency being a multiple of said first input frequency; and
    each of said veractors having an adjustment circuit connected in parallel therewith that adjusts an operating point of that veractor diode.

2. A mixer circuit as claimed in claim 1 wherein each adjustment circuit comprises a direct voltage source connected in series with an inductor, and said frequency mixer comprising a decoupling capacitor connected upstream or downstream from the parallel circuit of the varactor diode and the adjustment circuit.

3. A mixer circuit as claimed in claim 1 comprising a signal generator connected to said second input that generates said second input signal.

4. A mixer circuit as claimed in claim 1 comprising no amplifier elements other than said veractor diodes.

5. A local coil arrangement for a magnetic resonance apparatus comprising:
    a reception coil that receives a magnetic resonance signal and produces a first input signal therefrom exhibiting a first input frequency;
    a signal generator that generates a second input signal having an input frequency that is a multiple of said first input frequency;
    a balanced frequency mixer having a first input connected to said coil to receive said first input signal therefrom, and a second input connected to said signal generator to receive said second input signal therefrom;
    said balanced frequency mixer comprising at least two amplifier elements each formed by a veractor diode, that mix said first and second input signals with each other into a mix signal comprising a first signal component and a second signal component, said first signal component exhibiting a first component frequency that is a sum of said first and second input frequencies, and said second signal component exhibiting a second component frequency that is a difference between said first and second input frequencies;
    said balanced frequency mixer having an output at which at least one of said first and second signal components of said mix signal is tapped;
    said second input and said output being decoupled from each other; and
    each of said veractor diodes having an adjustment circuit connected in parallel therewith that adjusts an operating point of that veractor diode.

* * * * *